US011489016B2

(12) United States Patent
Yang et al.

(10) Patent No.: US 11,489,016 B2
(45) Date of Patent: Nov. 1, 2022

(54) DISPLAY DEVICE INCLUDING SUBPIXEL HAVING ONE-STACK ORGANIC LIGHT EMITTING LAYER AND SUBPIXEL HAVING TWO-STACK ORGANIC LIGHT EMITTING LAYER

(71) Applicant: LG Display Co., Ltd., Seoul (KR)

(72) Inventors: YuCheol Yang, Paju-si (KR); Suhyeon Kim, Paju-si (KR); MoonSoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 129 days.

(21) Appl. No.: 16/726,450

(22) Filed: Dec. 24, 2019

(65) Prior Publication Data

US 2020/0212120 A1 Jul. 2, 2020

(30) Foreign Application Priority Data

Dec. 27, 2018 (KR) .................. 10-2018-0170516

(51) Int. Cl.
*H01L 27/32* (2006.01)
*H01L 51/50* (2006.01)
(Continued)

(52) U.S. Cl.
CPC ........ *H01L 27/3209* (2013.01); *H01L 27/322* (2013.01); *H01L 27/3213* (2013.01);
(Continued)

(58) Field of Classification Search
CPC ............... H01L 27/3213; H01L 27/322; H01L 27/3211; H01L 51/504; H01L 27/3246;
(Continued)

(56) References Cited

U.S. PATENT DOCUMENTS 5,703,436 A * 12/1997 Forrest .................. C09K 11/06
313/506
8,049,420 B2 11/2011 Tamura et al.
(Continued)

FOREIGN PATENT DOCUMENTS

KR 10-2010-0071725 A 6/2010
KR 10-1542398 B1 8/2015
(Continued)

*Primary Examiner* — David Chen
(74) *Attorney, Agent, or Firm* — Polsinelli PC

(57) ABSTRACT

A display device comprises a substrate provided with a first subpixel, a second subpixel, a third subpixel, and a fourth subpixel, a first electrode provided on the substrate, an organic light emitting layer arranged on the first electrode, and a second electrode arranged on the organic light emitting layer, wherein the organic light emitting layer includes a first organic light emitting layer and a second organic light emitting layer, the first organic light emitting layer and the second organic light emitting layer are arranged on the first subpixel, the second subpixel, and the fourth subpixel, only the second organic light emitting layer is arranged on the third subpixel, only the first organic light emitting layer emits light on the first subpixel and the second subpixel, only the second organic light emitting layer emits light on the third subpixel, and both of the first organic light emitting layer and the second light emitting layer emit light on the fourth subpixel. Since the organic light emitting layer may emit light in accordance with one-stack voltage even in case of a two-stack structure of the first subpixel and the second subpixel, overall power consumption may be reduced.

20 Claims, 14 Drawing Sheets

(51) Int. Cl.
 *H01L 51/52* (2006.01)
 *G02B 27/01* (2006.01)
 *G06F 1/16* (2006.01)

(52) U.S. Cl.
 CPC ...... *H01L 27/3246* (2013.01); *H01L 27/3258* (2013.01); *H01L 51/5036* (2013.01); *H01L 51/5044* (2013.01); *H01L 51/5278* (2013.01); *G02B 27/0172* (2013.01); *G06F 1/163* (2013.01); *H01L 2227/323* (2013.01)

(58) Field of Classification Search
 CPC ............. H01L 27/3209; H01L 51/5278; H01L 27/3216; H01L 27/3206; H01L 27/3258; H01L 51/5044; H01L 2251/5376; H01L 51/5036
 USPC ....... 257/40, 59, 72, 89, 51.022; 438/28, 29, 438/34, 35, 99
 See application file for complete search history.

(56) References Cited

U.S. PATENT DOCUMENTS

| | | | |
|---|---|---|---|
| 2005/0093435 A1* | 5/2005 | Suh | H01L 27/322 313/504 |
| 2006/0006792 A1* | 1/2006 | Strip | H01L 27/3209 313/500 |
| 2014/0183499 A1* | 7/2014 | Kim | H01L 51/56 438/35 |
| 2016/0307970 A1* | 10/2016 | Kam | H01L 27/3213 |
| 2017/0278894 A1 | 9/2017 | Sato et al. | |
| 2017/0352709 A1 | 12/2017 | Hack et al. | |
| 2018/0019285 A1* | 1/2018 | Seo | H01L 33/44 |

FOREIGN PATENT DOCUMENTS

| | | |
|---|---|---|
| KR | 10-2017-0038061 A | 4/2017 |
| KR | 10-2017-0137577 A | 12/2017 |

\* cited by examiner

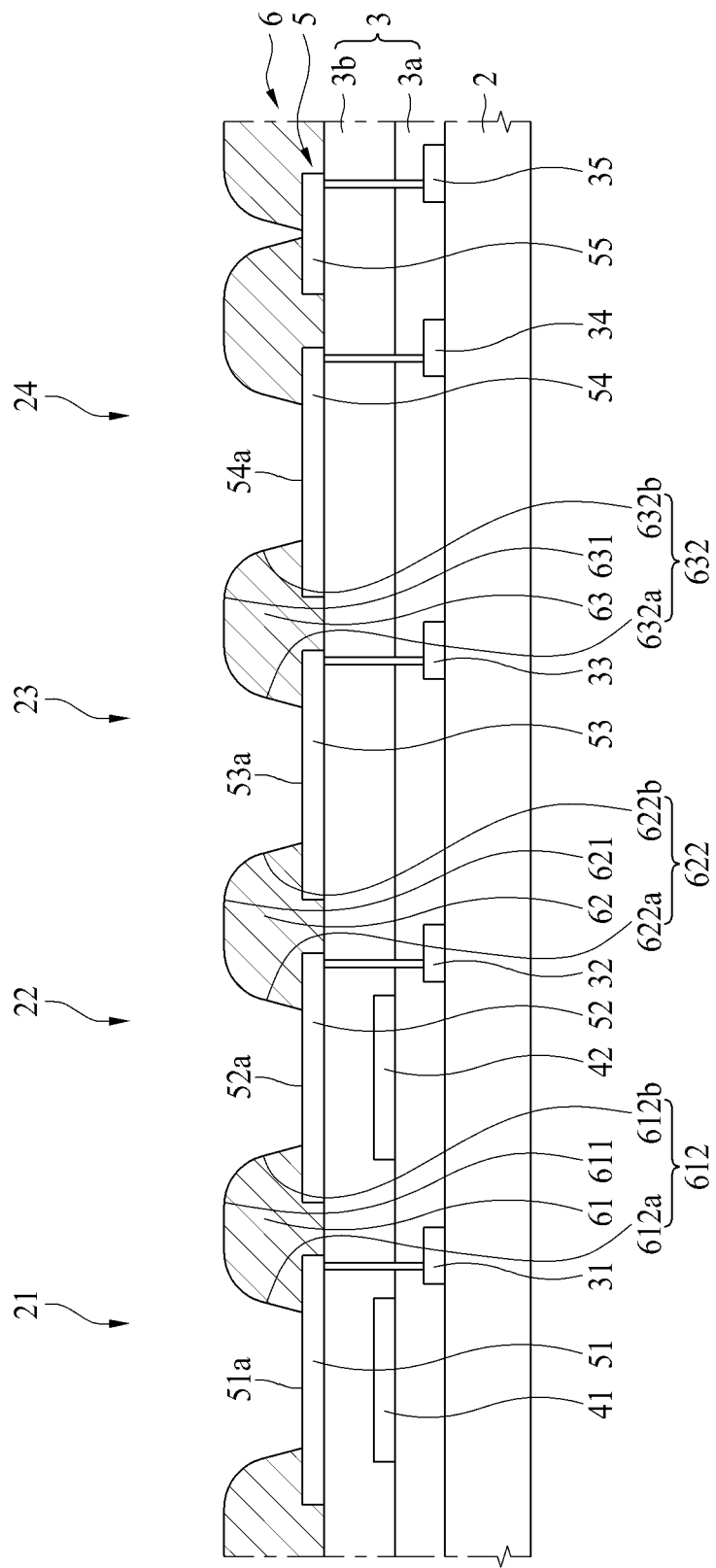

DISPLAY DEVICE INCLUDING SUBPIXEL HAVING ONE-STACK ORGANIC LIGHT EMITTING LAYER AND SUBPIXEL HAVING TWO-STACK ORGANIC LIGHT EMITTING LAYER

CROSS REFERENCE TO RELATED APPLICATION

This application claims priority from Korean Patent Application No. 10-2018-0170516, filed on Dec. 27, 2018, which is hereby incorporated by reference in its entirety.

BACKGROUND

Field of the Disclosure

The present disclosure relates to a display device displaying an image.

Description of the Background

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, in the case that FMM technology is used to form red, green and blue pixels of an organic light emitting layer, it is possible to manufacture a small-to-medium panel by a mask shadow but it is difficult to apply a large area to this panel for a problem of sagging of a deposition mask. Even in the case that a panel is manufactured using FMM, there is a limitation to reduce a size per pixel and therefore it is difficult to apply ultra-high resolution to the panel.

SUMMARY

The present disclosure has been made in view of the above problems, and the present disclosure provides a display device that can reduce power consumption needed to allow an organic light emitting layer to emit light.

In accordance with an aspect of the present disclosure, the above-described can be accomplished by the provision of a display device comprising a substrate provided with a first subpixel, a second subpixel, a third subpixel, and a fourth subpixel, a first electrode provided on the substrate, an organic light emitting layer arranged on the first electrode, and a second electrode arranged on the organic light emitting layer, wherein the organic light emitting layer includes a first organic light emitting layer and a second organic light emitting layer, the first organic light emitting layer and the second organic light emitting layer are arranged on the first subpixel, the second subpixel, and the fourth subpixel, only the second organic light emitting layer is arranged on the third subpixel, only the first organic light emitting layer emits light on the first subpixel and the second subpixel, only the second organic light emitting layer emits light on the third subpixel, and both of the first organic light emitting layer and the second light emitting layer emit light on the fourth subpixel.

The display device according to the present disclosure includes the first to the fourth subpixels, wherein the first subpixel and the second subpixel have a two-stack deposited structure of the first organic light emitting layer and the second organic light emitting layer but are provided to allow only the first organic light emitting layer to emit light. Therefore, since the organic light emitting layer may emit light by using a voltage of one-stack even in case of the two-stack structure, overall power consumption may be reduced.

In addition to the effects of the present disclosure as mentioned above, additional objects and features of the present disclosure will be clearly understood by those skilled in the art from the following description of the present disclosure.

SCHEMATIC DESCRIPTION OF THE DRAWINGS

The above features and other advantages of the present disclosure will be more clearly understood from the following detailed description taken in conjunction with the accompanying drawings, in which:

FIGS. 5A to 5H are schematic cross-sectional views illustrating a manufacturing process of a display device according to an aspect of the present disclosure.

DETAILED DESCRIPTION

Figure 1:
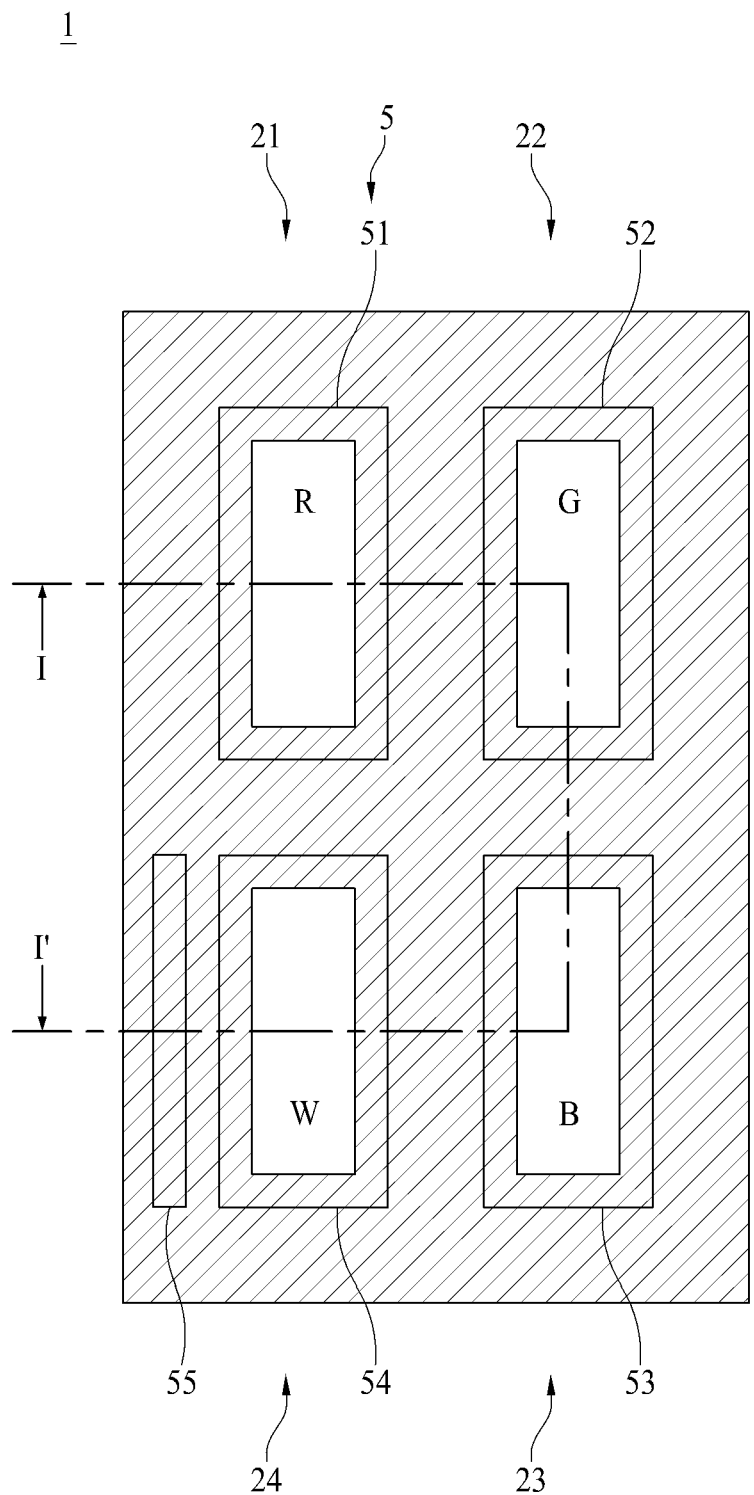
FIG. 1 is a schematic plan view illustrating a display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements is not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the display device according to the present disclosure will be described in detail with reference to the accompanying drawings. Wherever possible, the same reference numbers will be used throughout the drawings to refer to the same or like parts.

Figure 2:
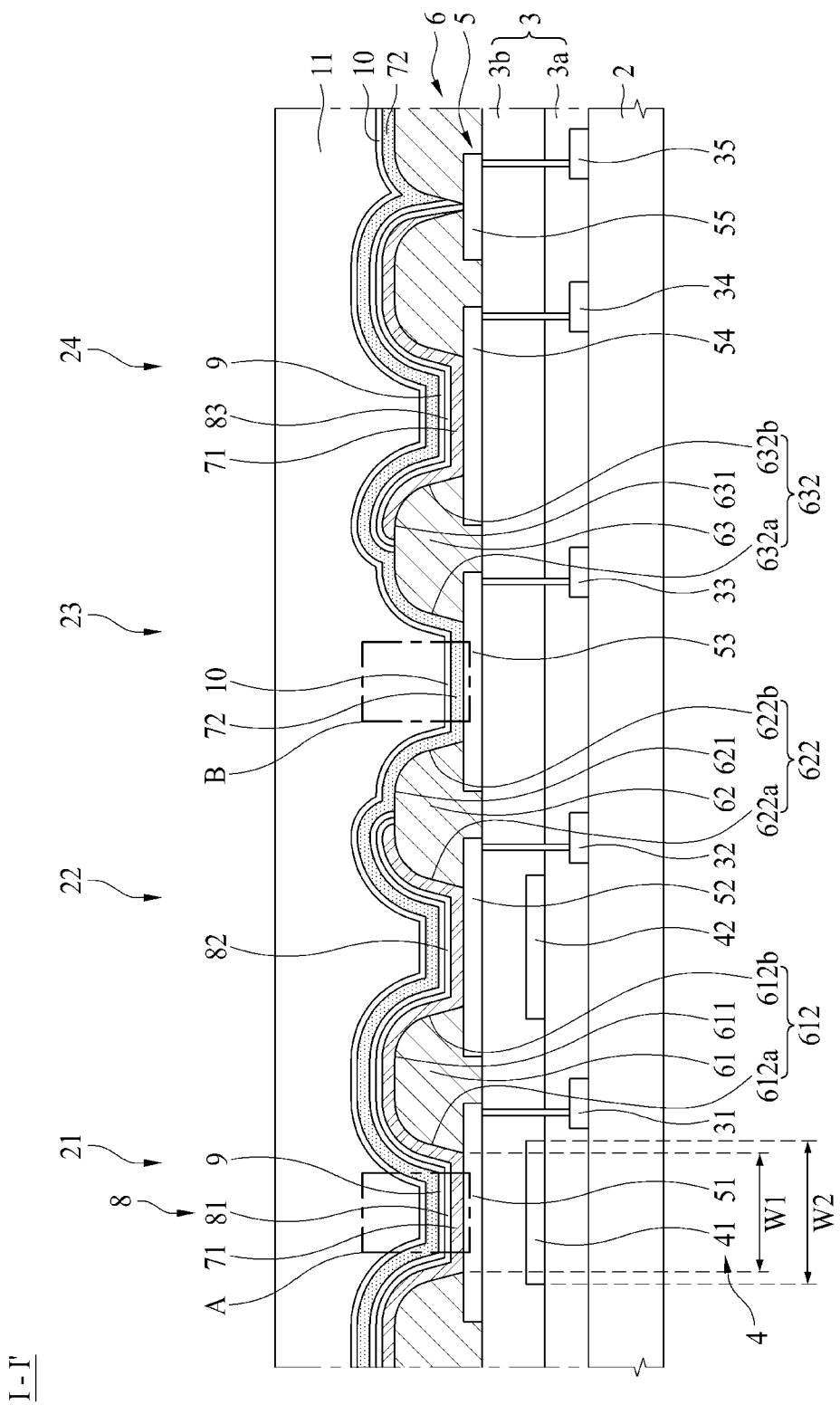
FIG. 2 is a schematic cross-sectional view taken along line I-I shown in FIG. 1.
Figure 3:
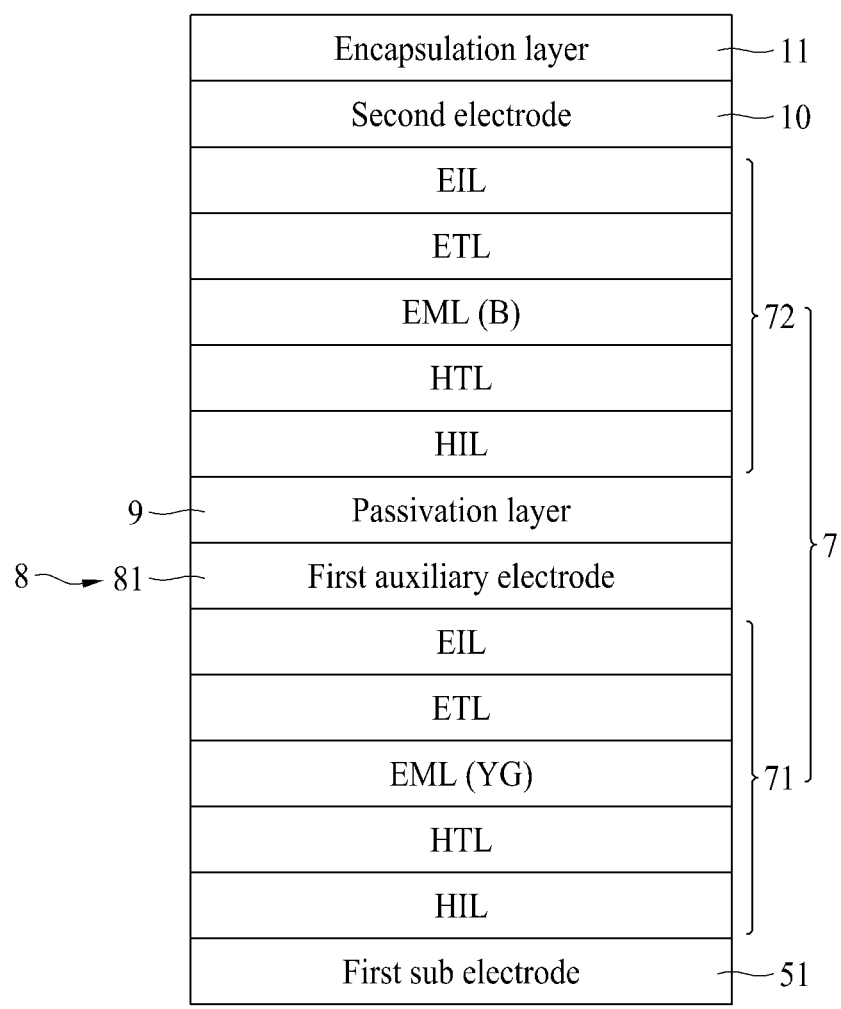
FIG. 3 is a schematic view illustrating a part A shown in FIG. 2.
Figure 4:
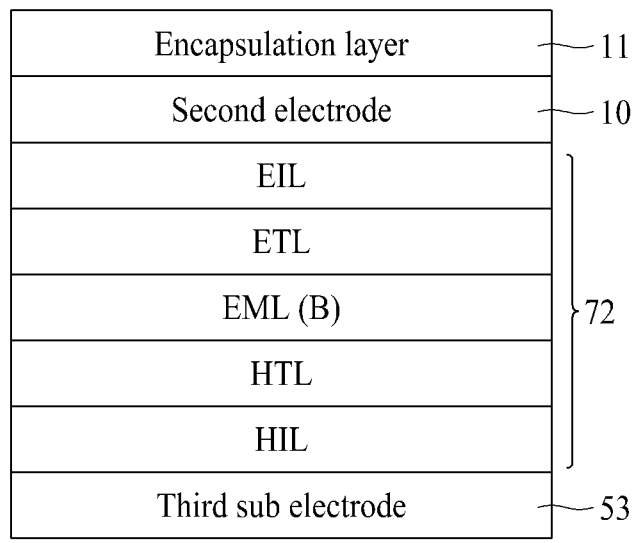
FIG. 4 is a schematic view illustrating a part B shown in FIG. 2.

FIG. 1 is a schematic plan view illustrating a display device according to one aspect of the present disclosure, FIG. 2 is a schematic cross-sectional view taken along line I-I shown in the FIG. 1, FIG. 3 is a schematic structured view illustrating a part A shown in FIG. 2, and FIG. 4 is a schematic structured view illustrating a part B shown in FIG. 2.

Referring to FIGS. 1 and 2, the display device 1 according to one aspect of the present disclosure comprises a substrate 2, a circuit element layer 3, a color filter layer 4, a first electrode 5, a bank 6, an organic light emitting layer 7, an auxiliary electrode 8, a passivation layer 9, a second electrode 10, and an encapsulation layer 11.

The substrate 2 may be a plastic film, a glass substrate, or a semiconductor substrate such as silicon. The substrate 2 may be made of a transparent material or an opaque material. The display device 1 according to one aspect of the present disclosure is provided in a bottom emission method in which emitted light is emitted to a bottom portion, and therefore a transparent material may be used as a material of the substrate 2.

A first subpixel 21, a second subpixel 22, a third subpixel 23, and a fourth subpixel 24 are provided on the substrate 2. The second subpixel 22 according to one example may be arranged to be adjacent to one side of the first subpixel 21. The third subpixel 23 according to one example may be arranged to be adjacent to one side of the second subpixel 22. The fourth subpixel 24 according to one example may be arranged to be adjacent to one side of the third subpixel 23. Therefore, the first subpixel 21, the second subpixel 22, the third subpixel 23 and the fourth subpixel 24 may sequentially be arranged on the substrate 2. The first to fourth subpixels 21, 22, 23 and 24, as shown in FIG. 1, may be arranged in, but not limited to, a rectangular shape to constitute one pixel.

The first subpixel 21 may be provided to emit red (R) light, the second subpixel 22 may be provided to emit green (G) light, the third subpixel 23 may be provided to emit blue (B) light, and the fourth subpixel 24 may be provided to emit white (W) light, but these subpixels are not limited to this case. Also, an arrangement sequence of the subpixels 21, 22, 23 and 24 may be changed in various ways.

Each of the first subpixel 21, the second subpixel 22, the third subpixel 23, and the fourth subpixel 24 may be provided to include the first electrode 5, the organic light emitting layer 7, the second electrode 10, and the encapsulation layer 11. Also, each of the first subpixel 21 and the second subpixel 22 may be provided to further include a color filter layer 4. However, if the organic light emitting layer 7 provided on the third subpixel 23 is provided to emit blue light, the third subpixel 23 may not include a color filter layer 4, and if the organic light emitting layer 7 provided on the fourth subpixel 24 is provided to emit white light, the fourth subpixel 24 may not include a color filter layer 4.

The circuit element layer 3 is arranged on one surface of the substrate 2.

A circuit element comprising a plurality of thin film transistors 31, 32, 33 and 34, various types of signal lines, and a capacitor is provided on the circuit element layer 3 per each of the subpixels 21, 22, 23 and 24. In this case, the fourth subpixel 24 may be provided with another thin film transistor 35. The signal lines may include gate lines, data lines, power lines and reference lines, and the thin film transistors 31, 32, 33, 34 and 35 may include a switching thin film transistor, a driving thin film transistor, and a sensing thin film transistor. The subpixels 21, 22, 23 and 24 may be defined by a crossing structure of gate lines, reference voltage lines, power supply lines, and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 5.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first thin film transistor 31, a second thin film transistor 32, a third thin film transistor 33 and a fourth thin film transistor 34 are arranged in the circuit element layer 3 separately for each of the subpixels 21, 22, 23 and 24. As described above, the fourth subpixel 24 may further be provided with a fifth thin film transistor 35.

The first thin film transistor 31 according to one example may be connected to a first sub electrode 51 arranged on the first subpixel 21 to apply a driving voltage for emitting light of a color corresponding to the first subpixel 21.

The second thin film transistor 32 according to one example may be connected to a second sub electrode 52 arranged on the second subpixel 22 to apply a driving voltage for emitting light of a color corresponding to the second subpixel 22.

The third thin film transistor 33 according to one example may be connected to a third sub electrode 53 arranged on the third subpixel 23 to apply a driving voltage for emitting light of a color corresponding to the third subpixel 23.

The fourth thin film transistor 34 according to one example may be connected to a fourth sub electrode 54 arranged on the fourth subpixel 24 to apply a driving voltage for emitting light of a color corresponding to the fourth subpixel 24.

The fifth thin film transistor 35 according to one example may be connected to a fifth sub electrode 55 arranged on the fourth subpixel 24 to apply a driving voltage for emitting light of a color corresponding to the fourth subpixel 24.

Each of the first subpixel 21, the second subpixel 22, the third subpixel 23, and the fourth subpixel 24 according to one example supplies a predetermined current to an organic light emitting layer in accordance with the data voltage of the data line when a gate signal from the gate line is input thereto using each of the thin film transistors 31, 32, 33, 34 and 35. For this reason, the organic light emitting layer of each of the first subpixel 21, the second subpixel 22, the third subpixel 23 and the fourth subpixel 24 may emit light with a predetermined brightness in accordance with the predetermined current.

The circuit element layer 3 may include an insulating layer 3a covering the transistors 31, 32, 33, 34 and 35, and a planarization layer 3b covering the insulating layer 3a. The insulating layer 3a is to prevent the respective thin film transistors 31, 32, 33, 34 and 35 from being in contact with each other. The planarization layer 3b may be formed to have an upper surface which is planarized so that the first electrode 5 and the substrate 2 are arranged in parallel. A color filter layer 4 may be formed inside the planarization layer 3b.

The color filter layer 4 includes a first color filter 41 of a red color R arranged to correspond to the first subpixel 21 and a second color filter 42 of a green color G arranged to correspond to the second subpixel 22. Since the third subpixel 23 is provided to emit blue light, a color filter is not arranged there and therefore blue light B emitted from the organic light emitting layer 7 is emitted from the third subpixel 23 as it is. Also, since the fourth subpixel 24 is provided to emit white light W, a color filter is not arranged there and therefore white light W emitted from the organic light emitting layer 7 is emitted from the fourth subpixel 24 as it is.

When the organic light emitting layer 7 is provided to emit yellow-green light YG or white light W, in the first subpixel 21, yellow-green light YG or white light W emitted from the organic light emitting layer 7 passes through the first color filter 41 of the red color, whereby only the red right R transmits the first subpixel 21. In the second subpixel 22, yellow-green light YG or white light W emitted from the organic light emitting layer 7 passes through the second color filter 42 of the green color, whereby only the green light transmits the second subpixel 22.

The first electrode 5 is formed on the circuit element layer 3. In more detail, the first electrode 5 may be formed on the upper surface of the planarization layer 3b. The first electrode 5 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). However, since the display device 1 according to one aspect of the present disclosure is based on a bottom emission method, the first electrode 5 may be made of a transparent material. Therefore, the first electrode 5 may transmit light emitted from the organic light emitting layer 7. The first electrode 5 may be an anode. The first electrode 5 may include a first sub electrode 51, a second sub electrode 52, a third sub electrode 53, a fourth sub electrode 54, and a fifth sub electrode 55.

The first sub electrode 51 may be provided on the first subpixel 21. The first sub electrode 51 may be formed on the circuit element layer 3. The first sub electrode 51 is connected to a source electrode of the first thin film transistor 31 through a contact hole that passes through the planarization layer 3b and the insulating layer 3a.

The second sub electrode 52 may be provided on the second subpixel 22. The second sub electrode 52 may be formed on the circuit element layer 3. The second sub electrode 52 is connected to a source electrode of the second thin film transistor 32 through a contact hole that passes through the planarization layer 3b and the insulating layer 3a.

The third sub electrode 53 may be provided on the third subpixel 23. The third sub electrode 53 may be formed on the circuit element layer 3. The third sub electrode 53 is connected to a source electrode of the third thin film transistor 33 through a contact hole that passes through the planarization layer 3b and the insulating layer 3a.

The fourth sub electrode 54 may be provided on the fourth subpixel 24. The fourth sub electrode 54 may be formed on the circuit element layer 3. The fourth sub electrode 54 is connected to a source electrode of the fourth thin film transistor 34 through a contact hole that passes through the planarization layer 3b and the insulating layer 3a.

The fifth sub electrode 55 may be provided on the fourth subpixel 24. The fifth sub electrode 55 may be arranged on a place spaced apart from the fourth sub electrode 54. The fifth sub electrode 55 may be formed on the circuit element layer 3. The fifth sub electrode 55 is connected to a source electrode of the fifth thin film transistor 35 through a contact hole that passes through the planarization layer 3b and the insulating layer 3a.

In this case, the first to fifth thin film transistors 31, 32, 33, 34 and 35 may be N-type TFTs.

If the first to fifth thin film transistors 31, 32, 33, 34 and 35 are made of P-type TFTs, each of the first to fifth sub electrodes 51, 52, 53, 54 and 55 may be connected to a drain electrode of each of the first to fifth thin film transistors 31, 32, 33, 34 and 35.

In other words, each of the first to fifth sub electrodes 51, 52, 53, 54 and 55 may be connected to a source electrode or a drain electrode of the corresponding transistor in accordance with types of the first to fifth transistors 31, 32, 33, 34 and 35.

Since the display device 1 according to one aspect of the present disclosure is provided in a bottom emission method, at least one of an auxiliary electrode 8 arranged in the organic light emitting layer 7 and the second electrode 10 arranged on the organic light emitting layer 7 may be provided to include a reflective material to reflect light emitted from the organic light emitting layer 7 to a bottom portion. However, the auxiliary electrode 8 provided on the fourth subpixel 24 provided to emit white light may not include a reflective material. This is to transmit light emitted from the second organic light emitting layer 72 arranged above the auxiliary electrode 8, which will be described later. Meanwhile, since the display device 1 according to one aspect of the present disclosure is based on a bottom emission method, the color filter layer 4 may be arranged below the organic light emitting layer 7.

Referring to FIG. 2 again, the bank 6 may be provided between each of the first subpixel 21, the second subpixel 22, the third subpixel 23 and the fourth subpixel 24 to partition the first subpixel 21, the second subpixel 22, the third subpixel 23 and the fourth subpixel 24 from one another. The bank 6 may include a first bank 61, a second bank 62, and a third bank 63.

The first bank 61 is provided between the first sub electrode 51 and the second sub electrode 52. The first bank 61 according to one example is to partition the first subpixel 21 and the second subpixel 22 from each other. The first bank 61 may be provided to cover edges of each of the first sub electrode 51 and the second sub electrode 52, thereby partitioning the first subpixel 21 and the second subpixel 22 from each other. The first bank 61 serves to define a subpixel, that is, a light emitting area. Also, an area where the first bank 61 is formed may be defined as a non-light emitting area because the area does not emit light. Therefore, the first thin film transistor 31 may be arranged to correspond to the first bank 61. As the first thin film transistor 31 is arranged to correspond to the first bank 61, the first thin film transistor 31 may apply a voltage to the first sub electrode 51 without covering a light emitting area of the first subpixel 21.

The first bank 61 may be formed of an organic film such as acryl resin, epoxy resin, phenolic resin, polyamide resin, and polyimide resin. The organic light emitting layer 7 is formed on the first electrode 5 and the first bank 61.

The first bank 61 may include an upper surface 611 and an inclined surface 612. The inclined surface 612 may include a first inclined surface 612a and a second inclined surface 612b.

The upper surface 611 of the first bank 61 is a surface placed on the top of the first bank 61.

The first inclined surface 612a of the first bank 61 is a surface extended from the upper surface 611 to an upper surface 51a (shown in FIG. 5A) of the first sub electrode 51. Therefore, the first inclined surface 612a may have a predetermined angle with the upper surface 51a of the first sub electrode 51. The predetermined angle may be greater than 50° and less than 90° as a width of the bank becomes narrow in accordance with high resolution of the display device. A width of the bank may become narrow as the distance between subpixels becomes narrow.

The second inclined surface 612b of the first bank 61 is a surface extended from the upper surface 611 to an upper surface 52a (shown in FIG. 5A) of the second sub electrode 52. Therefore, the second inclined surface 612b may have a predetermined angle with the upper surface 52a of the second sub electrode 52. An angle between the second inclined surface 612b and the upper surface 52a of the second sub electrode 52 may be the same as that between the first inclined surface 612a and the upper surface 51a of the first sub electrode 51.

The second bank 62 is provided between the second sub electrode 52 and the third sub electrode 53. The second bank 62 according to one example may be provided to cover edges of each of the second sub electrode 52 and the third sub electrode 53, thereby partitioning the second subpixel 22 and the third subpixel 23 from each other. The second bank 62 serves to define a subpixel, that is, a light emitting area. Also, an area where the second bank 62 is formed may be defined as a non-light emitting area because the area does not emit light. The second thin film transistor 32 may be arranged to correspond to the second bank 62. As the second thin film transistor 32 is arranged to correspond to the second bank 62, the second thin film transistor 32 may apply a voltage to the second sub electrode 52 without covering the light emitting area of the second subpixel 22. The second bank 62 may be formed of the same material as that of the first bank 61. The organic light emitting layer 7 is formed on the first electrode 5 and the second bank 62.

The second bank 62 may include an upper surface 621 and an inclined surface 622. The inclined surface 622 may include a first inclined surface 622a and a second inclined surface 622b.

The upper surface 621 of the second bank 62 is a surface placed on the top of the second bank 62.

The first inclined surface 622a of the second bank 62 is a surface extended from the upper surface 621 to the upper surface 52a of the second sub electrode 52. Therefore, the first inclined surface 622a may have a predetermined angle with the upper surface 52a of the second sub electrode 52. The predetermined angle may be greater than 50° and less than 90° as a width of the bank becomes narrow in accordance with high resolution of the display device.

The second inclined surface 622b of the second bank 62 is a surface extended from the upper surface 621 to an upper surface 53a (shown in FIG. 5A) of the third sub electrode 53. Therefore, the second inclined surface 622b may have a predetermined angle with the upper surface 53a of the third sub electrode 53. An angle between the second inclined surface 622b and the upper surface 53a of the third sub electrode 53 may be the same as that between the first inclined surface 622a and the upper surface 52a of the second sub electrode 52.

The third bank 63 is provided between the third sub electrode 53 and the fourth sub electrode 54. The third bank 63 according to one example may be provided to cover edges of each of the third sub electrode 53 and the fourth sub electrode 54, thereby partitioning the third subpixel 23 and the fourth subpixel 24 from each other. The third bank 63 serves to define a subpixel, that is, a light emitting area. Also, an area where the third bank 63 is formed may be defined as a non-light emitting area because the area does not emit light. The third thin film transistor 33 may be arranged to correspond to the third bank 63. As the third thin film transistor 33 is arranged to correspond to the third bank 63, the third thin film transistor 33 may apply a voltage to the third sub electrode 53 without covering the light emitting area of the third subpixel 23. The third bank 63 may be formed of the same material as that of the first bank 61. The organic light emitting layer 7 is formed on the first electrode 5 and the third bank 63.

The third bank 63 may include an upper surface 631 and an inclined surface 632. The inclined surface 632 may include a first inclined surface 632a and a second inclined surface 632b.

The upper surface 631 of the third bank 63 is a surface placed on the top of the third bank 63.

The first inclined surface 632a of the third bank 63 is a surface extended from the upper surface 631 to the upper surface 53a of the third sub electrode 53. Therefore, the first inclined surface 632a may have a predetermined angle with the upper surface 53a of the third sub electrode 53. The predetermined angle may be greater than 50° and less than 90° as a width of the bank becomes narrow in accordance with high resolution of the display device.

The second inclined surface 632b of the third bank 63 is a surface extended from the upper surface 631 to an upper surface 54a (shown in FIG. 5A) of the fourth sub electrode 54. Therefore, the second inclined surface 632b may have a predetermined angle with the upper surface 54a of the fourth sub electrode 54. An angle between the second inclined surface 632b and the upper surface 54a of the fourth sub electrode 54 may be the same as that between the first inclined surface 632a and the upper surface 53a of the third sub electrode 53.

Meanwhile, the fourth thin film transistor 34 may be arranged to correspond to a bank adjacent to the third bank 63. As the fourth thin film transistor 34 is arranged to correspond to a bank adjacent to the third bank 63, the fourth thin film transistor 34 may apply a voltage to the fourth sub electrode 54 without covering the light emitting area of the fourth subpixel 24.

Also, the fifth thin film transistor 35 may be arranged on another bank adjacent to the bank adjacent to the third bank 63 to correspond to another bank. Therefore, the fifth thin film transistor 35 may apply a voltage to the fifth sub electrode 55 without covering the light emitting area of the fourth subpixel 24.

Referring to FIGS. 2 to 4, the organic light emitting layer 7 is arranged on the first electrode 5. The organic light emitting layer 7 according to one example may be provided as at least one of a first organic light emitting layer 71 and a second organic light emitting layer 72. The second organic light emitting layer 72 may be provided to cover the first organic light emitting layer 71 at the top of the first organic light emitting layer 71. In the present disclosure, the first subpixel 21, the second subpixel 22, and the fourth subpixel 24 may be provided with a two-stack structure deposited with the first organic light emitting layer 71 and the second organic light emitting layer 72, and the third subpixel 23 may be provided with one-stack structure of the second organic light emitting layer 72. In this case, the second organic light emitting layer 72 arranged on the first sub electrode 51, the second organic light emitting layer 72 arranged on the second sub electrode 52, the second organic light emitting layer 72 arranged on the third sub electrode 53, and the second organic light emitting layer 72 arranged on the fourth sub electrode 54 may be provided to be connected with one another. In other words, the second organic light emitting layer 72 may be arranged as a common layer entirely formed on the first subpixel 21, the second subpixel 22, the third subpixel 23 and the fourth subpixel 24.

The display device 1 according to one aspect of the present disclosure not only may increase easiness of manufacture but also may increase a yield as the number of manufacturing processes can be reduced by forming the second organic light emitting layer 72 as a common layer, compared with the case that the second organic light emitting layer is formed to be patterned per subpixel.

The first organic light emitting layer 71 may be provided to emit yellow-green light and more specifically, may include a hole transporting layer HTL, a yellow-green light emitting layer EML(YB), and an electron transporting layer ETL. The first organic light emitting layer 71 may further include a hole injecting layer HIL and an electron injecting layer EIL. The first organic light emitting layer 71 may be provided in such a manner that a red light emitting layer EML(R) and a green light emitting layer EML(G) instead of the yellow-green light emitting layer EML(YB). One-stack structure may be formed using only the first organic light emitting layer 71.

The second organic light emitting layer 72 may be provided to emit blue light and more specifically, may include a hole transporting layer HTL, a blue light emitting layer EML(B), and an electron transporting layer ETL. The second organic light emitting layer 72 may further include a hole injecting layer HIL and an electron injecting layer EIL. One-stack structure may be formed using only the second organic light emitting layer 72. Therefore, the first subpixel 21, the second subpixel 22 and the fourth subpixel 24 having a deposited structure with the first organic light emitting layer 71 and the second organic light emitting layer 72 may be provided with a two-stack structure.

The hole injecting layer HIL, the hole transporting layer HTL, the electron transporting layer ETL, and the electron injecting layer EIL of the organic light emitting layer 7 are intended to improve emission efficiency of the light emitting layer EML. The hole transporting layer HTL and the electron transporting layer ETL are intended to balance between an electron and a hole, and the hole injecting layer HIL and the electron injecting layer EIL are intended to enhance injection of an electron and a hole.

If a high potential voltage is applied to the first electrode 5 and a low potential voltage is applied to the second electrode 10, holes and electrons are transferred to the light emitting layer through the hole transporting layer and the electron transporting layer, respectively and combined with each other in the light emitting layer to emit light.

The second electrode 10 may be arranged on the top of the organic light emitting layer 7, that is, on the top of the second organic light emitting layer 72 to cover the second organic light emitting layer 72.

Referring to FIGS. 2 and 3, the auxiliary electrode 8 is arranged between the first organic light emitting layer 71 and the second light emitting layer 72. In more detail, the auxiliary electrode 8 may include a first auxiliary electrode 81 arranged on the first subpixel 21, a second auxiliary electrode 82 arranged on the second subpixel 22, and a third auxiliary electrode 83 arranged on the fourth subpixel 24. As described above, since only the second organic light emitting layer 72 emitting blue light is arranged on the third subpixel 23, an electric field may be formed between the third sub electrode 53 and the second electrode 10, whereby the auxiliary electrode may not be provided.

The first auxiliary electrode 81 may be provided on the first subpixel 21. The first auxiliary electrode 81 may be arranged between the first organic light emitting layer 71 and the second organic light emitting layer 72 of the first subpixel 21. As the first auxiliary electrode 81 is arranged on the upper surface of the first organic light emitting layer 71 and forms an electric field with the first sub electrode 51, the first organic light emitting layer 71 may emit light. That is, the first auxiliary electrode 81 may serve to perform the same function as that of a second electrode which is a cathode in view of the first organic light emitting layer 71. The first auxiliary electrode 81 may be connected to the second electrode 10. Although not shown, the first auxiliary electrode 81 may be connected to the second electrode 10 by being connected to a voltage supply portion of the display device 1 according to one example of the present disclosure. Therefore, a voltage may be applied from the voltage supply portion to the first auxiliary electrode 81, and the voltage applied to the first auxiliary electrode 81 may be the same as a voltage applied from the voltage supply portion to the second electrode 10. Therefore, referring to FIGS. 2 and 3, since the same voltage is applied to the first auxiliary electrode 81 and the second electrode 10, the second organic light emitting layer 72 arranged between the first auxiliary electrode 81 and the second electrode 10 cannot form an electric field and therefore cannot emit blue light. As a result, an electric field may be formed only between the first auxiliary electrode 81 and the first sub electrode 51 in the first subpixel 21, whereby the first subpixel 21 may emit only yellow-green light. Furthermore, referring to FIG. 2, since a red color filter which is a first color filter 41 is arranged on the first subpixel 21, the first subpixel 21 may be provided that green light is shielded and only red light is emitted.

Referring to FIG. 2 again, the second auxiliary electrode 82 may be provided on the second subpixel 22. The second auxiliary electrode 82 may be arranged between the first organic light emitting layer 71 and the second organic light emitting layer 72 of the second subpixel 22. As the second auxiliary electrode 82 is arranged on the upper surface of the first organic light emitting layer 71 and forms an electric field with the second sub electrode 52, the first organic light emitting layer 71 may emit light. That is, the second auxiliary electrode 82 may serve to perform the same function as that of the second electrode which is a cathode in view of the first organic light emitting layer 71. The second auxiliary electrode 82 may be connected to the second electrode 10. Although not shown, the second auxiliary electrode 82 may be connected to the second electrode 10 by being connected to the voltage supply portion of the display device 1 according to one aspect of the present disclosure. Therefore, a voltage may be applied from the voltage supply portion to the second auxiliary electrode 82 and the voltage applied to the second auxiliary electrode 82 may be the same as a voltage applied from the voltage supply portion to the second electrode 10. Therefore, since the same voltage is applied to the second auxiliary electrode 82 and the second electrode 10, the second organic light emitting layer 72 arranged between the second auxiliary electrode 82 and the second electrode 10 cannot form an electric field and therefore cannot emit blue light. As a result, since an electric field may be formed only between the second auxiliary electrode 82 and the second sub electrode 52 in the second subpixel 22, only yellow-green light may be emitted. Furthermore, referring to FIG. 2, since a green color filter which is the second color filter 42 is arranged on the second subpixel 22, the second subpixel 22 may be provided that red light is shielded and only green light is emitted.

The third auxiliary electrode 83 may be provided on the fourth subpixel 24. The third auxiliary electrode 83 may be arranged between the first organic light emitting layer 71 and the second organic light emitting layer 72 of the fourth subpixel 24. As the third auxiliary electrode 83 is arranged on the upper surface of the first organic light emitting layer 71 and forms an electric field with the fourth sub electrode 54, the first organic light emitting layer 71 may emit light. That is, the third auxiliary electrode 83 may serve to perform the same function as a cathode in view of the first organic light emitting layer 71. Therefore, the first organic light emitting layer 71 of the fourth subpixel 24 may emit yellow-green light by forming an electric field between the fourth sub electrode 54 and the third auxiliary electrode 83.

However, unlike the first auxiliary electrode 81 and the second auxiliary electrode 82, the third auxiliary electrode 83 is not connected to the second electrode 10. Instead, the third auxiliary electrode 83, as shown in FIG. 2, is connected to the fifth sub electrode 55 and therefore a voltage may be applied from the fifth thin film transistor 35 to the fifth sub electrode 55. In this case, the voltage applied to the third auxiliary electrode 83 may be different from the voltage supplied to the second electrode 10. This is because that the fourth subpixel 24 is provided to emit white light. When the same voltage as that applied to the second electrode is applied to the third auxiliary electrode, an electric field is not formed between the third auxiliary electrode and the second electrode and therefore the second organic light emitting layer does not emit light and only the first organic light emitting layer emits light, whereby only yellow-green light is emitted. Therefore, since the fourth subpixel 24 is provided to allow both yellow-green light of the first organic light emitting layer 71 and blue light of the second organic light emitting layer 72 to be emitted by supplying a different voltage to the third auxiliary electrode 83 and the second electrode 10, white light may be emitted by mixture of yellow-green light and blue light.

On the other hand, since the fourth subpixel 24 is provided to allow both the first organic light emitting layer 71 and the second organic light emitting layer 72 to emit light as described above, the fourth subpixel 24 emits white light, whereby a separate color filter does not need to be provided.

As a result, in the display device 1 according to one aspect of the present disclosure, the first subpixel 21, the second subpixel 22, and the fourth subpixel 24 are provided with a two-stack structure deposited with the first organic light emitting layer 71 and the second light emitting layer 72, and the third subpixel 23 is provided with one-stack structure only with the second organic light emitting layer 72. In this case, in the third subpixel 23, since only the second organic light emitting layer 72 emits light, blue light may be emitted. Since the fourth subpixel 24 is provided to allow both the first organic light emitting layer 71 and the second organic light emitting layer 72 to emit light, white light may be embodied. In the third subpixel 23 has a one-stack structure, and since the second organic light emitting layer 72 emits blue light, a blue color filter do not need to be provided. And, the fourth subpixel 24 has a two-stack structure, and since the first organic light emitting layer 71 emits yellow-green light and the second organic light emitting layer 72 emits blue light, a white color filter do not need to be provided. On the other hand, although the first subpixel 21 and the second subpixel 22 have a two-stack structure, the first auxiliary electrode 81 and the second auxiliary electrode 82 are connected to the second electrode 10 and the same voltage is applied from the voltage supply portion to the first auxiliary electrode 81 and the second auxiliary electrode 82, whereby only the first organic light emitting layer 71 may emit light. Therefore, in the display device 1 according to one aspect of the present disclosure, the first subpixel 21 and the second subpixel 22 have a two-stack structure, however, the first organic light emitting layer 71 may be allowed to emit light by the voltage supplied to one-stack structure, whereby overall power consumption may be reduced.

Referring to FIGS. 2 and 3 again, the passivation layer 9 electrically insulates the auxiliary electrode 8 from the second electrode 10. The passivation layer 9 may be arranged between the auxiliary electrode 8 and the second organic light emitting layer 72. The passivation layer 9, as shown in FIG. 2, may be formed with a structure surrounding the upper surface and the side of the auxiliary electrode 8 so that the second electrode 10 and the auxiliary electrode 8 are not in contact with each other. The passivation layer 9 may be made of, but not limited to, SiNx or a material including SiNx, and may be made of other materials as long as they can electrically insulate the auxiliary electrode 8 from the second electrode 10.

On the other hand, the passivation layer 9 arranged on the first subpixel 21 and the second subpixel 22 electrically insulates the auxiliary electrode 8 from the second electrode 10 in the emitting area where the organic light emitting layer 7 emits light. However, as described above, since the auxiliary electrode 8 and the second electrode 10 are connected to the voltage supply portion on a pad portion arranged on the non-light emitting area, the passivation layer 9 may not be provided between the auxiliary electrode 8 and the second electrode 10. However, the passivation layer 9 arranged on the fourth subpixel 24 may be provided to surround the third auxiliary electrode 83 to reach the pad portion which is the non-light emitting area so that the third auxiliary electrode 83 and the second electrode 10 are not in contact with each other because a different voltage is supplied to the third auxiliary electrode 83 and the second electrode 10.

In the display device 1 according to one aspect of the present disclosure, since the auxiliary electrode 8 and the second electrode 10 are in contact with the voltage supply portion, when a voltage is supplied from the voltage supply portion, the same voltage is supplied to the second electrode 10 arranged on the top of the second organic light emitting layer 72 and the auxiliary electrode 8 arranged on the bottom of the second organic light emitting layer 72. Therefore, an electric field is not formed between the second electrode 10 and the auxiliary electrode 8, whereby the second organic light emitting layer 72 may not emit light. Additionally, as the display device 1 according to one aspect of the present disclosure comprises the passivation layer 9 provided between the auxiliary electrode 8 and the second organic light emitting layer 72 to electrically insulate the auxiliary electrode 8 from the second electrode 10, an electric field may not be formed toward the second organic light emitting layer 72.

The second electrode 10 is provided to cover the second organic light emitting layer 72. The second electrode 10 according to one example is a common layer commonly formed on the first subpixel 21, the second subpixel 22, the third subpixel 23, and the fourth subpixel 24. Since the display device 1 according to one aspect of the present disclosure is based on a bottom emission method, the second electrode 10 may be formed of a metal material such as Al, Mg, and Ag to reflect light emitted from the organic light emitting layer 7. Therefore, the second electrode 10 may be provided to be opaque. Since a metal material has high reflectivity, the metal material may be a reflective material. Although not shown, the second electrode 10 may be connected to the voltage supply portion using an open mask. In this case, the second electrode 10 may be provided over the entire surface of the first to fourth subpixels 21, 22, 23 and 24. The encapsulation layer 11 may be formed on the second electrode 10.

The encapsulation layer 11 serves to prevent oxygen or water from being permeated into the organic light emitting layer 7, the passivation layer 9 and the second electrode 10. To this end, the encapsulation layer 11 may include at least one inorganic film and at least one organic film.

For example, the encapsulation layer 11 may include a first inorganic film, an organic film, and a second inorganic film. In this case, the first inorganic film is formed to cover the second electrode 10. The organic film is formed to cover the first inorganic film. The organic film is formed at a length long enough to prevent particles from being permeated into the organic light emitting layer 7, the passivation layer 9 and the second electrode 10 by passing through the first inorganic film. The second inorganic film may be formed to cover the organic film.

The encapsulation layer 11 is arranged to cover the second electrode 10. Since the second electrode 10 is formed of an opaque material as described above and reflects light emitted from the organic light emitting layer 7 toward the substrate 2, the light emitted from the organic light emitting layer 7 may not enter the encapsulation layer 11.

FIGS. 5A to 5H are schematic cross-sectional views illustrating a manufacturing process of a display device according to one aspect of the present disclosure. In the display device 1 according to one aspect of the present disclosure, through a manufacturing process below, the first subpixel 21, the second subpixel 22 and the fourth subpixel 24 may be provided with a deposited structure of the first organic light emitting layer 71, the second organic light emitting layer 72, the auxiliary electrode 8 and the passivation layer 9, and the third subpixel 23 may be provided in a structure where only the second organic light emitting layer 72 is arranged. Also, in the display device 1 according to one aspect of the present disclosure, the second organic light emitting layer 72 provided to emit blue light may be provided as a common layer over the first to fourth subpixels 21, 22, 23 and 24 through a manufacturing process below.

Referring to FIG. 5A, the first to fifth thin film transistors 31, 32, 33, 34 and 35 are formed in the insulating layer 3b of the circuit element layer 3 arranged on the substrate 2, and the first color filter 41 and the second color filter 42 are formed on the planarization layer 3b of the circuit element layer 3 to correspond to the first subpixel 21 and the second subpixel 22, respectively.

In this case, a portion of each of the first color filter 41 and the second color filter 42 may be arranged to overlap the bank 6. The portion of the first color filter 41 and the second color filter may mean an edge of each of the first color filter 41 and the second color filter 42. As the edge of each of the first color filter 41 and the second color filter 42 is arranged to overlap the bank 6, light emitted from each of the first subpixel 21 and the second subpixel 22 may pass through each of the first color filter 41 and the second color filter 42. That is, the color filters may prevent light from being emitted to the outside without passing therethrough.

In order that a portion of each of the first color filter 41 and the second color filter 42 is arranged to overlap the bank 6, as shown in FIG. 2, a width W2 of the first color filter 41 may be provided to be greater than a width W1 of the portion of the first sub electrode 51 which is not covered by the bank 6. Therefore, as described above, it is possible to prevent yellow-green light of the first organic light emitting layer 71 from being emitted to the outside without passing through the first color filter 41. However, the width W2 of the first color filter 41 is not limited to the above example, and if yellow-green light YG of the first organic light emitting layer 71 is prevented from being emitted to the outside, the width W2 of the first color filter 41 may be provided to be the same as the width W1 of the portion of the first sub electrode 51 which is not covered by the bank 6.

Likewise, a width of the second color filter 42 may be provided to be greater than a width of the portion of the second sub electrode 52 which is not covered by the bank 6. Therefore, as described above, it is possible to prevent yellow-green light YG of the first organic light emitting layer 71 from being emitted to the outside without passing through the second color filter 42. However, the width of the second color filter 42 is not limited to the above example, and if yellow-green light YG of the first organic light emitting layer 71 is prevented from being emitted to the outside, the width of the second color filter 42 may be provided to be the same as the width of the portion of the second sub electrode 52 which is not covered by the bank 6.

On the other hand, since only the second organic light emitting layer 72 emitting blue light is arranged on the third subpixel 23, a color filter may not be provided. Also, since the fourth subpixel 24 is provided to emit white light by mixing the first organic light emitting layer 71 emitting yellow-green light with the second organic light emitting layer 72 emitting blue light, a color filter may not be provided.

Then, after the planarization layer 3*b* is formed to cover upper surfaces of the first color filter 41, the second color filter 42 and the insulating layer 3*a*, the first to fifth sub electrodes 51, 52, 53, 54 and 55 are formed on the upper surface of the planarization layer 3*b* and a plurality of banks including first to third banks 61, 62, 63 and so on are formed to cover an edge of each of the first to fifth sub electrodes 51, 52, 53, 54 and 55.

Figure 5B:
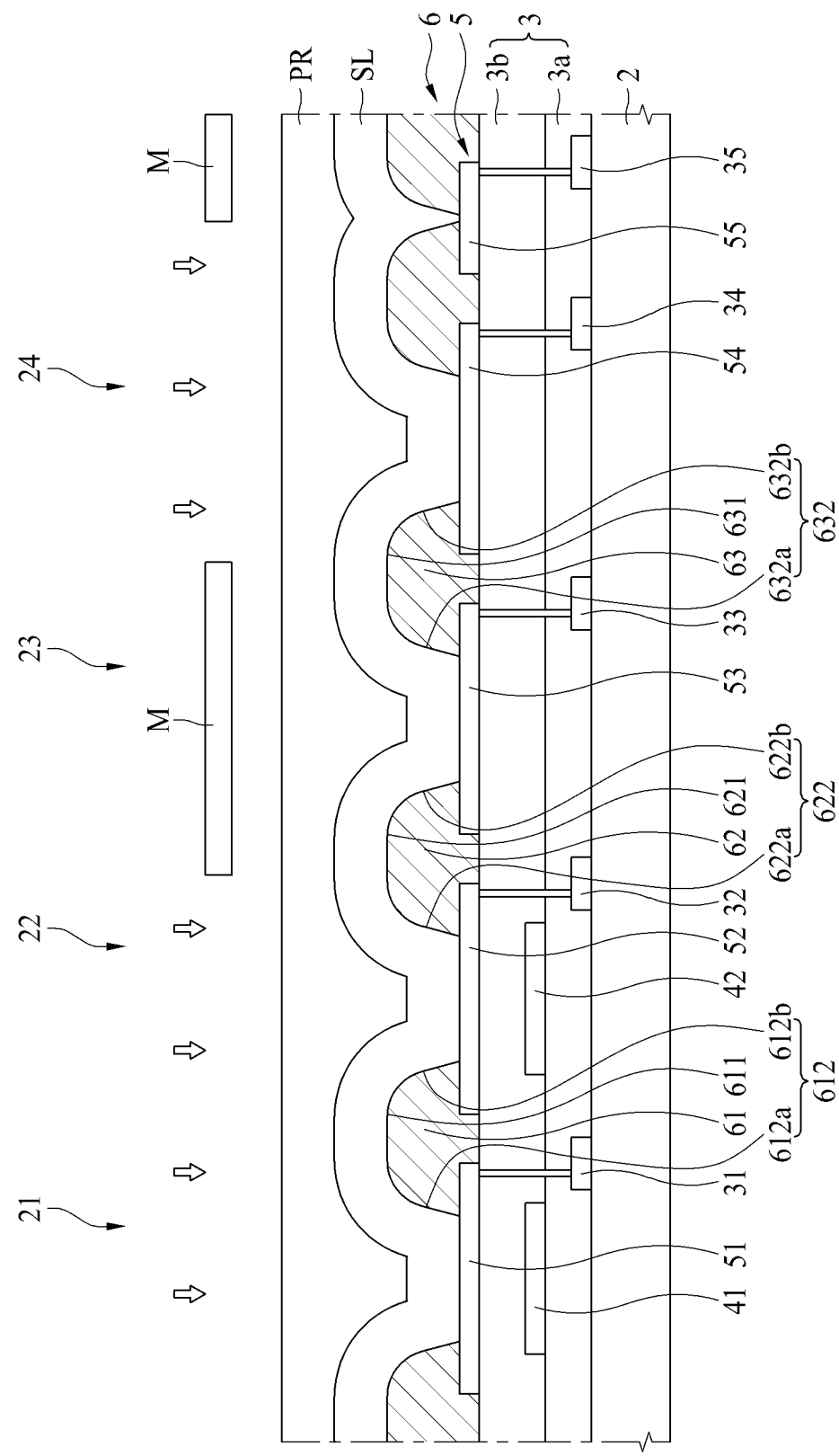

Then, referring to FIG. 5B, in a state that the first electrode 5 and the bank 6 are formed on the substrate 2 and the circuit element layer 3, after a shield layer SL and a PR layer are deposited in due order, a mask M is arranged on a place where a deposition hole H (shown in FIG. 5C) is to be formed, and then the other area is subjected to exposure. Therefore, property of the other area of the PR layer except the area where the deposition hole H is to be formed is changed. For example, property of the other area of the PR layer may be changed not to be etched even with a developing solution. The deposition hole H is an area where the first organic light emitting layer 71, the auxiliary electrode 8, and the passivation layer 9 are formed and may eventually become an upper surface of each of the first sub electrode 51, the second sub electrode 52, the fourth sub electrode 54, and the fifth sub electrode 55. The PR layer may be a photoresist layer.

Figure 5C:
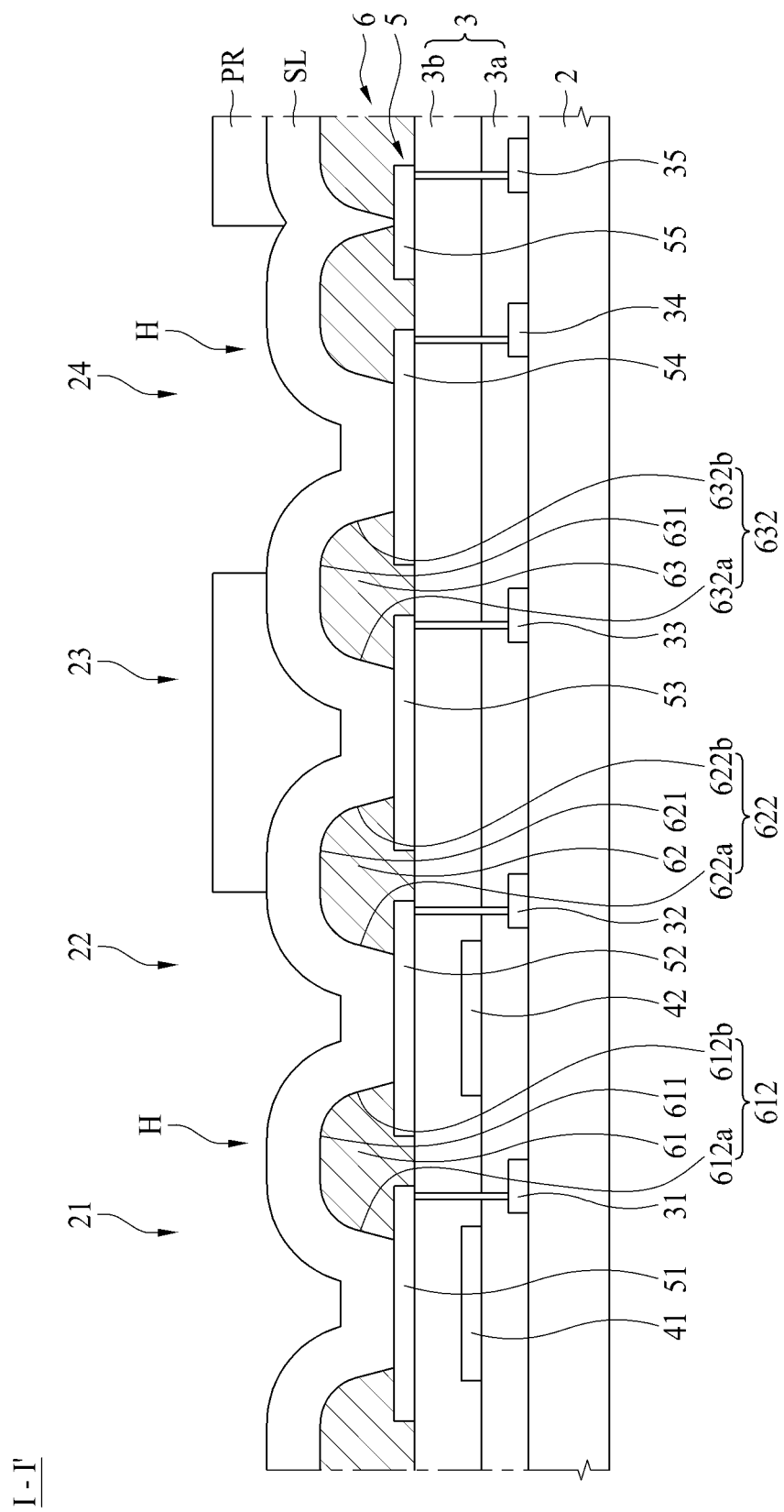

Then, referring to FIG. 5C, a primary removing process is performed to remove a PR layer, which is arranged on the area where the deposition hole is to be formed, by using a developing solution. The PR layer removed by the developing solution may be corroded by being put in the developing solution and then removed.

Figure 5D:
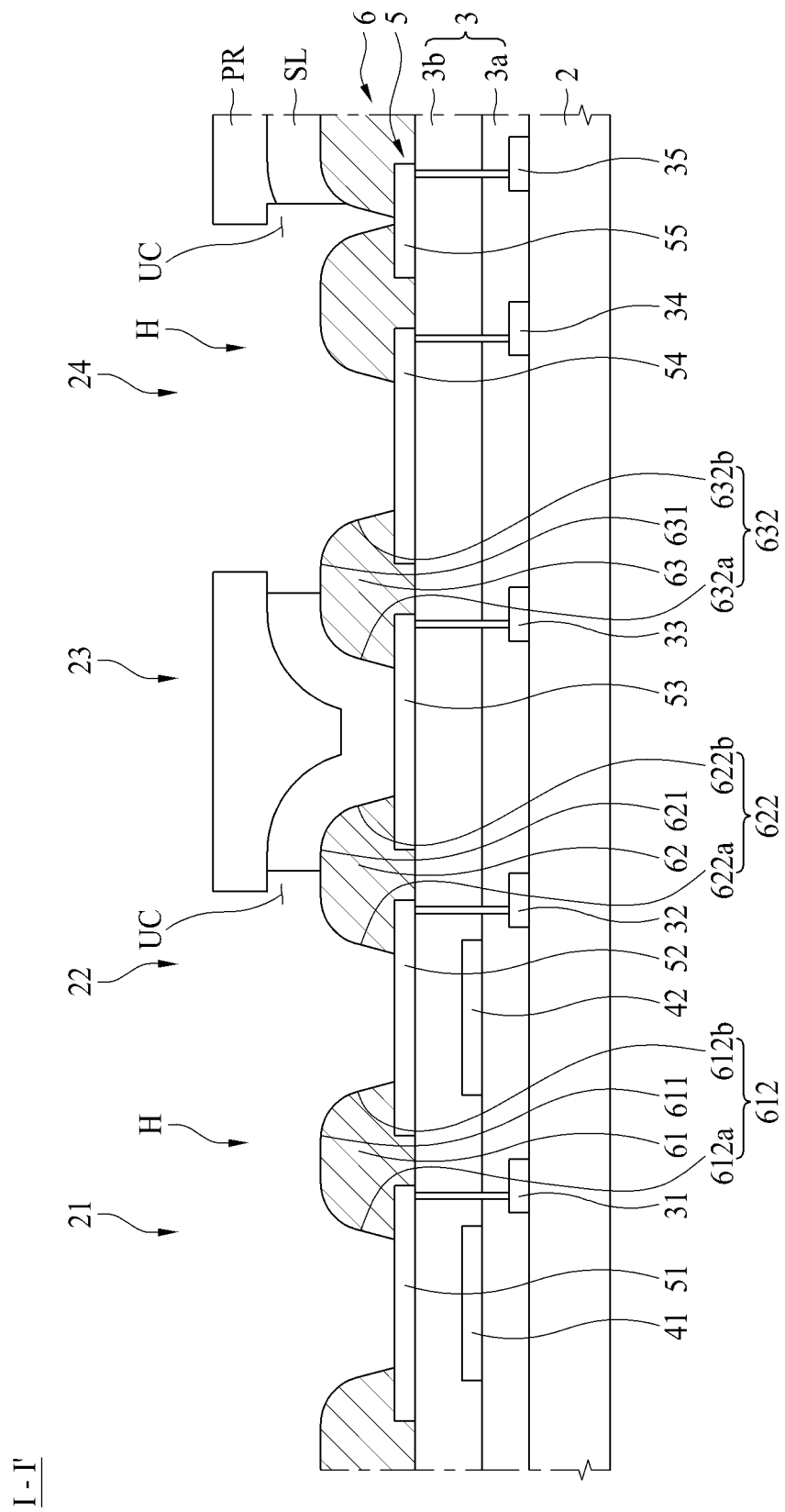

Then, referring to FIG. 5D, a secondary removing process is performed to remove a shield layer SL, which is arranged on the area where the deposition hole is to be formed, by using a developing solution. In this case, the time required to put the shield layer SL in the developing solution is increased in the secondary removing process as compared with the first removing process to increase a volume of the shield layer SL, which is to be removed, as compared with the primary removing process, whereby so called an under-cut (UC) area may be formed. Therefore, a width of the shield layer SL removed by the secondary removing process may be wider than a width of the PR layer removed by the primary removing process.

Figure 5E:
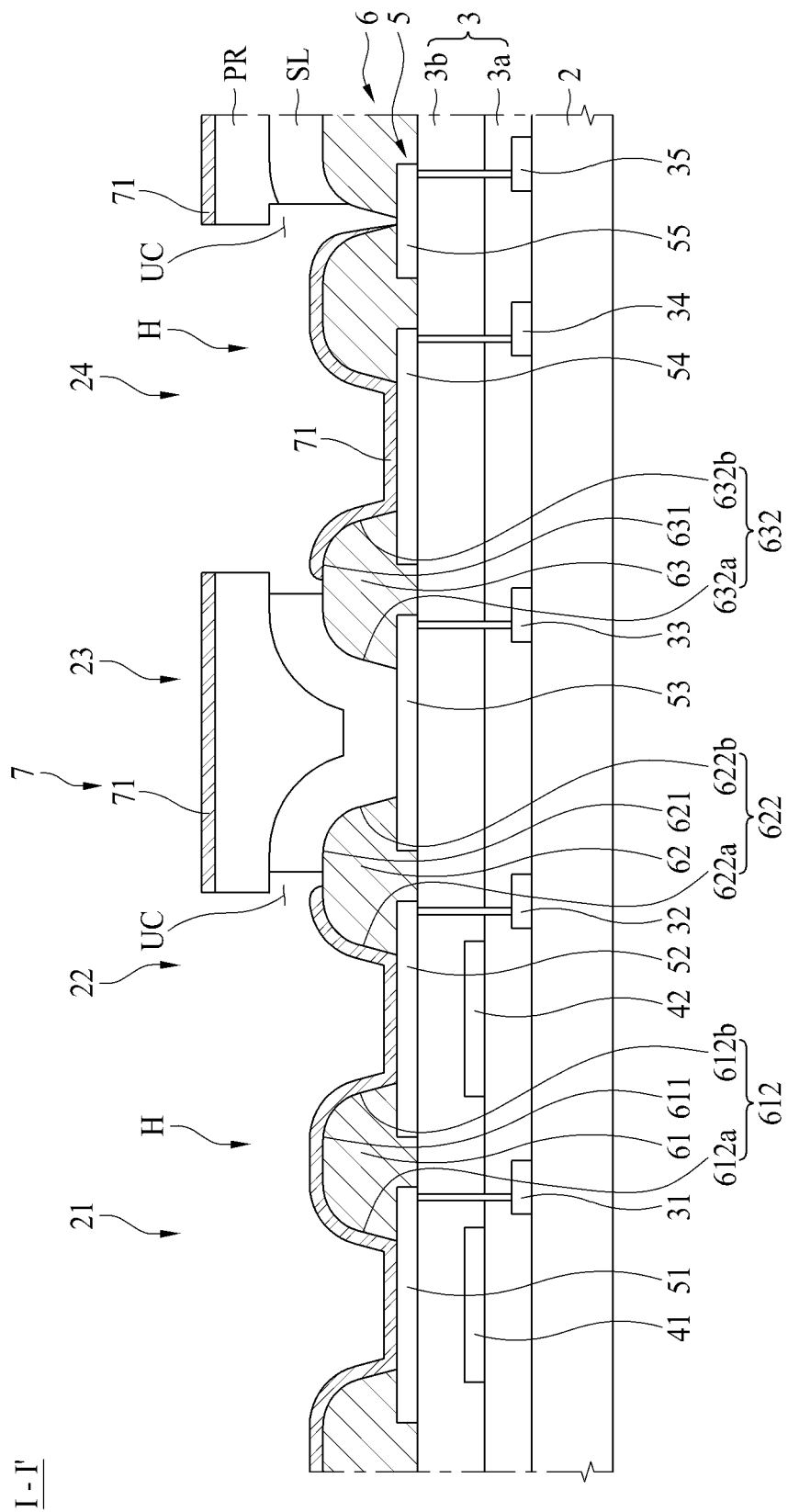
Figure 5F:
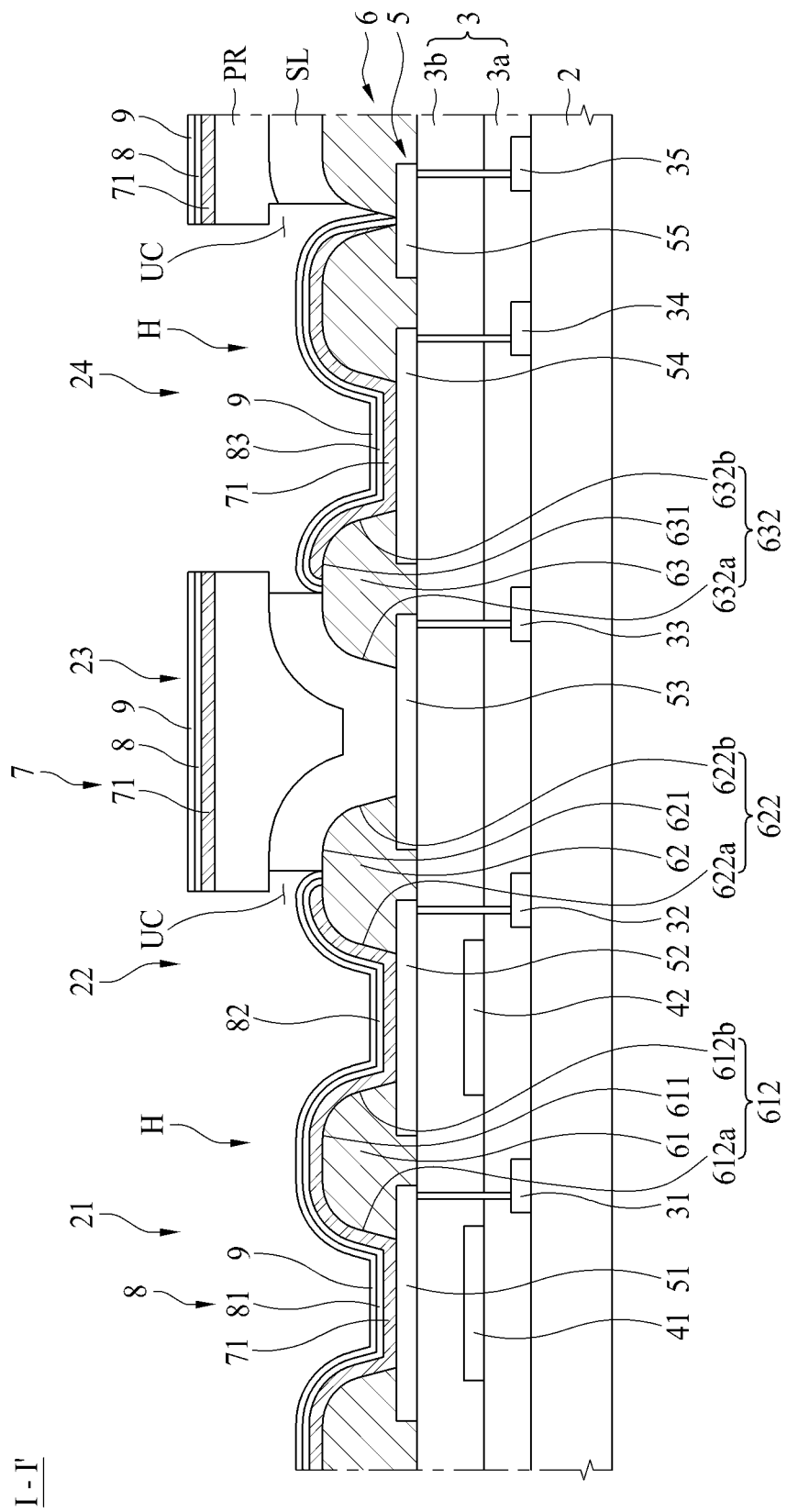

Then, referring to FIG. 5E, the first organic light emitting layer 71 is formed on the first sub electrode 51, the second sub electrode 52, the fourth sub electrode 54 and the fifth sub electrode 55. For example, the first organic light emitting layer 71 may be formed on the first sub electrode 51, the second sub electrode 52, the fourth sub electrode 54, and the fifth sub electrode 55 by sequentially depositing organic materials on the entire surface toward an upper surface of each of the first sub electrode 51, the second sub electrode 52, the fourth sub electrode 54, and the fifth sub electrode 55 from the outside of the PR layer in various manners. The organic materials may be deposited on the upper surface of each of the first sub electrode 51, the second sub electrode 52, the fourth sub electrode 54, and the fifth sub electrode 55 through the deposition hole H. In this case, the first organic light emitting layer 71 may little be deposited on the upper surface of the fifth sub electrode 55 due to the under-cut structure of the shield layer SL and low step coverage of the first organic light emitting layer 71. Therefore, light emission may not occur on the fifth sub electrode 55 as there is little the first organic light emitting layer 71 on the fifth sub electrode 55 even if a voltage is supplied to the fifth sub electrode 55. Likewise, the first organic light emitting layer 71 deposited on the upper surface of the second bank 62 and the upper surface of the third bank 63 may be formed only to the location spaced apart from the shield layer SL at a predetermined distance due to the under-cut structure and low step coverage. Therefore, the auxiliary electrode 8 and the passivation layer 9 may be inserted into a space formed between the first organic light emitting layer 71 and the shield layer SL during a follow-up process, thereby surrounding the first organic light emitting layer 71. On the other hand, organic materials may be deposited even on the PR layer due to such a process. The first organic light emitting layer 71 may be provided by sequentially depositing a hole injecting layer HIL, a hole transporting layer HTL, a yellow-green light emitting layer EML(YG), an electron transporting layer ETL, and an electron injecting layer EIL Then, referring to FIG. 5F, the auxiliary electrode 8 may be deposited on the entire surface to cover the first organic light emitting layer 71. Although not shown, one side of the auxiliary electrode 8 may be connected to the voltage supply portion provided in the non-light emitting area by using at least one of a contact method using a laser welding, a contact method using a partition structure, and a contact method using an under-cut structure. Therefore, once the second electrode 10 is connected to the voltage supply portion in a follow-up process, the auxiliary electrode 8 may be connected to the second electrode 10 on non-light emitting layer through the voltage supply portion. Therefore, since the auxiliary electrode 8 may function as a cathode, that is, the second electrode on the first subpixel 21 and the second subpixel 22, only the first organic light emitting layer 71 may emit light.

Then, the passivation layer 9 is deposited on the entire surface to cover the auxiliary electrode 8. The passivation layer 9 may be provided to cover the upper surface of the auxiliary electrode 8 or the upper surface and the side of the auxiliary electrode 8. The passivation layer 9 may be formed of SiNx based material to electrically insulate the auxiliary electrode 8 from the second electrode 10.

Figure 5G:
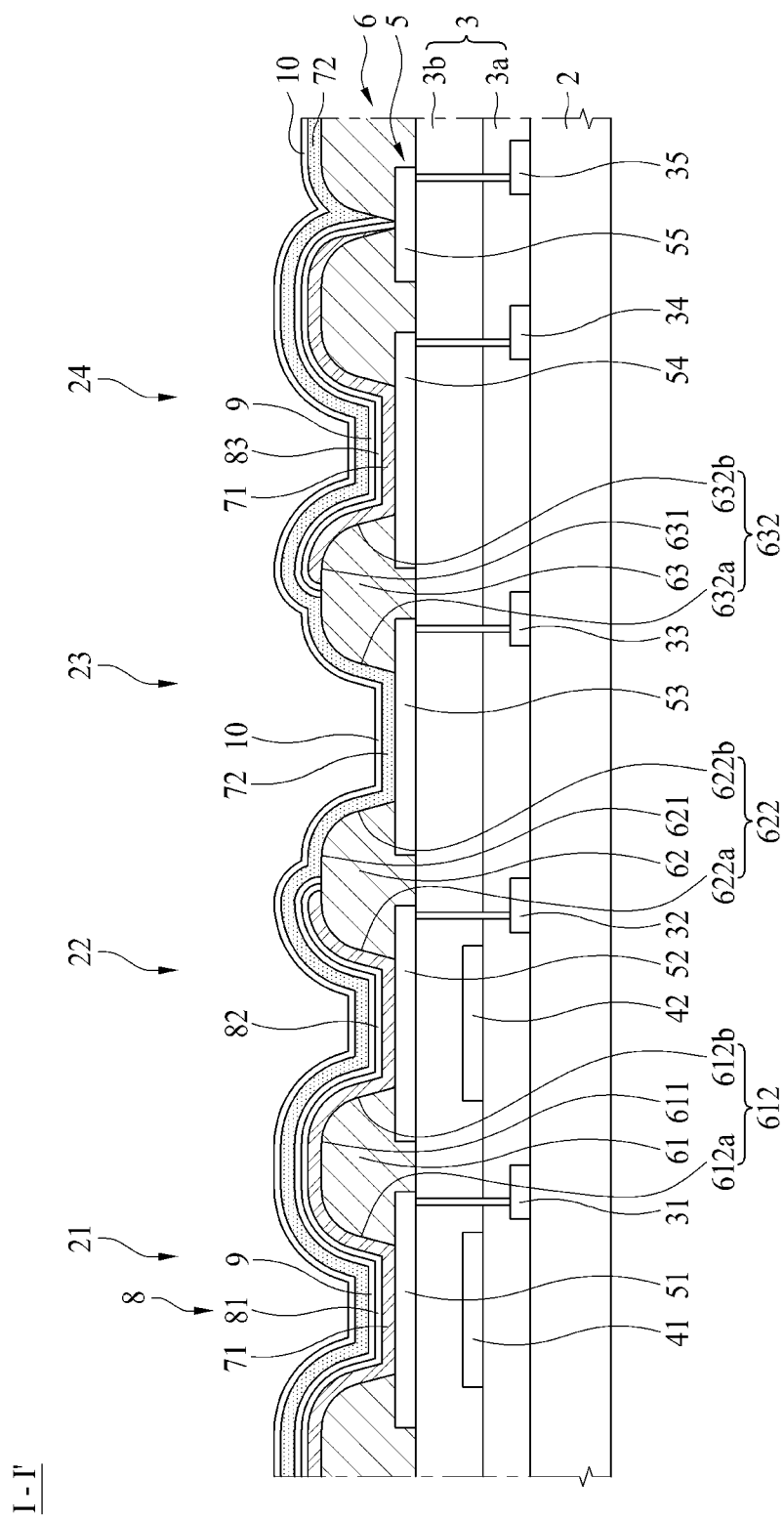

Then, referring to FIG. 5G, the shield layer SL deposited on the upper surfaces of the third sub electrode 53, the second bank 62 and the third bank 63 is lifted-off through a strip process. Therefore, the first organic light emitting layer 71 of which upper surface is protected by the auxiliary electrode 8 and the auxiliary electrode 8 of which upper surface is protected by the passivation layer 9 may remain on the upper surface of each of the first sub electrode 51, the second sub electrode 52, the fourth sub electrode 54, and the fifth sub electrode 55.

In this case, the passivation layer 9 may additionally serve to prevent the auxiliary electrode 8 and the first organic light emitting layer 71 from being damaged by a strip solution used during the lift-off process by preventing the strip solution from being in contact with the auxiliary electrode 8.

Then, the second organic light emitting layer 72 and the second electrode 10 are sequentially deposited on the entire surface to cover the first organic light emitting layer 71, the auxiliary electrode 8, the passivation layer 9, the third sub electrode 53, the second bank 62, the third bank 63, which are arranged on each of the first subpixel 21, the second subpixel 22 and the fourth subpixel 24. Therefore, the second organic light emitting layer 72 and the second electrode 10 may be provided as common layers over the first to fourth subpixels 21, 22, 23 and 24. In this case, the second organic light emitting layer 72 may be provided by sequentially depositing a hole injecting layer HIL, a hole transporting layer HTL, a blue light emitting layer EML(B), an electron transporting layer ETL, and an electron injecting layer EIL. Also, one side of the second electrode 10 may be connected to the voltage supply portion while covering all of the first to fourth subpixels 21, 22, 23 and 24. Therefore, a voltage for forming an electric field may be applied from the voltage supply portion to the first and second auxiliary electrodes 81 and 82 arranged on the first subpixel 21 and the second subpixel 22 and the second electrode 10 at the same time. However, the third auxiliary electrode 83 arranged on the fourth subpixel 24 may not be connected to the second electrode 10 and receive a different voltage from that of the second electrode 10 so that the fourth subpixel 24 emits white light. As a result, the third auxiliary electrode 83 may be connected to another voltage supply portion not the voltage supply portion to which the second electrode 10 is connected, whereby a voltage different from the voltage applied to the second electrode 10 may be applied to the third auxiliary electrode 83.

Figure 5H:
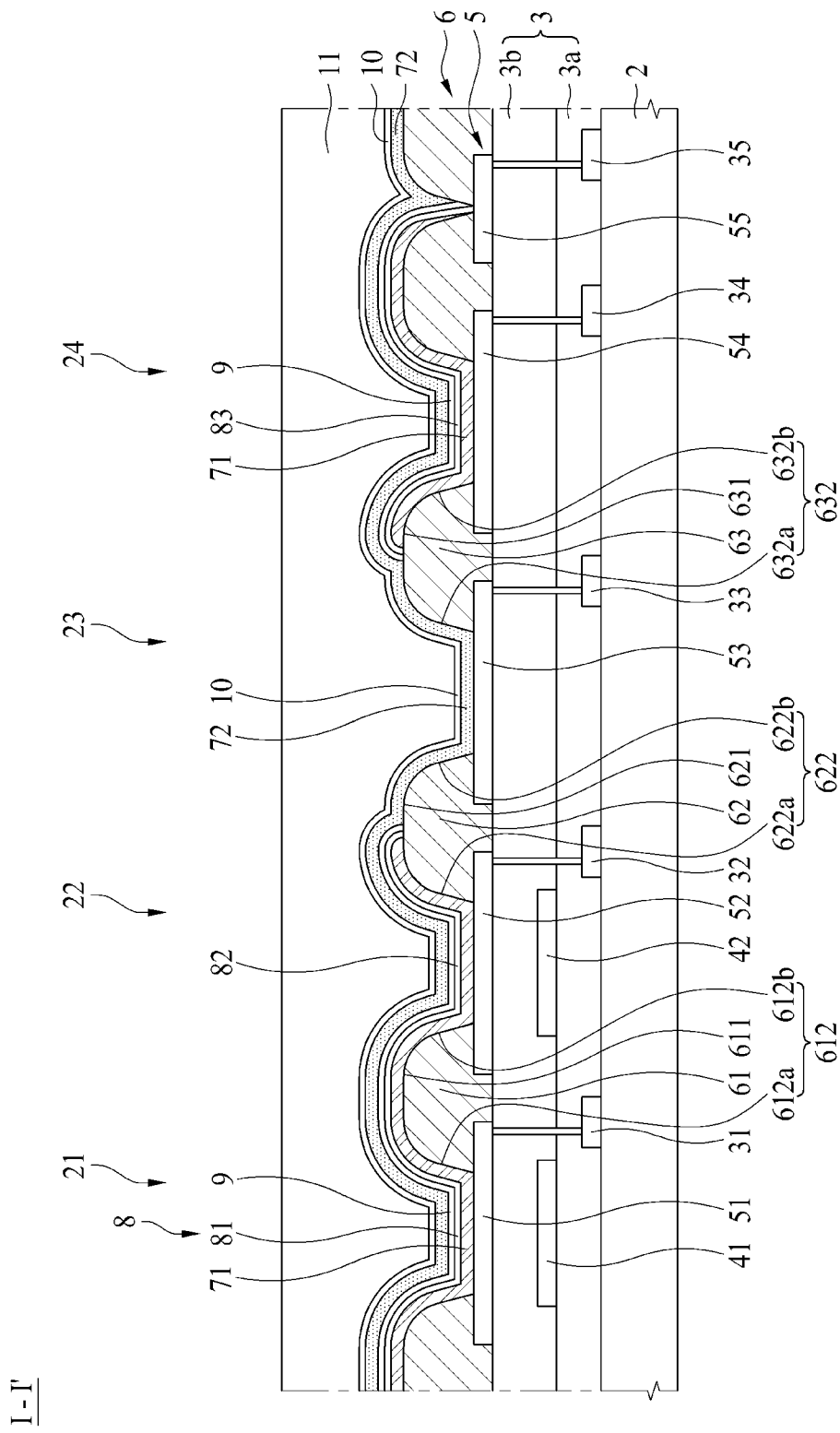

Then, referring to FIG. 5H, the encapsulation layer 11 is entirely deposited on the second electrode 10. The encapsulation layer 11 may be provided with a deposited structure of at least one inorganic film and at least one organic film. Therefore, a manufacturing process of the display device 1 according to one aspect of the present disclosure may partially be completed.

As a result, although the display device 1 according to one aspect of the present disclosure may be provided to allow one pixel to emit all of red light, green light, blue light and white light while reducing overall power consumption as the first organic light emitting layer 71 is allowed to emit light using a voltage supplied to one-stack structure although the first subpixel 21 and the second subpixel 22 have a two-stack structure.

Figure 6A:
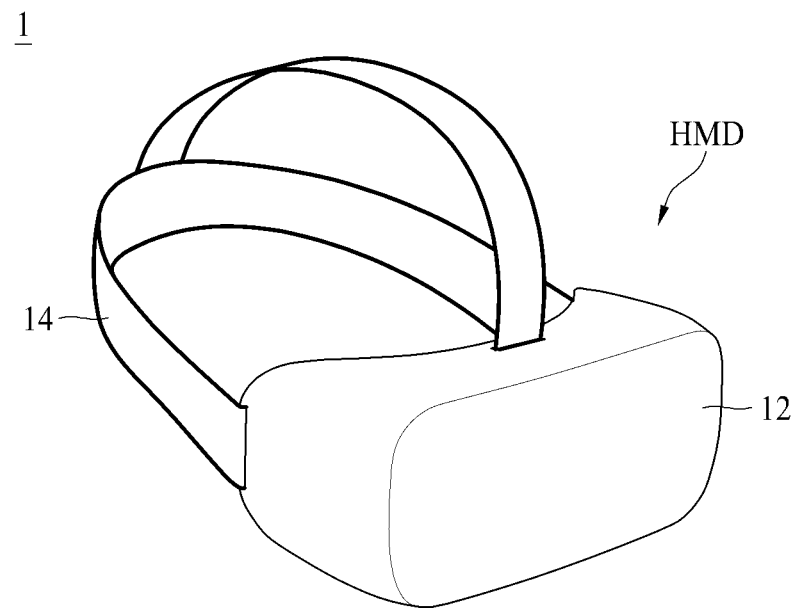
FIGS. 6A to 6C are views illustrating a display device according to another aspect of the present disclosure, and relate to a head-mounted display (HMD) device.
Figure 6B:
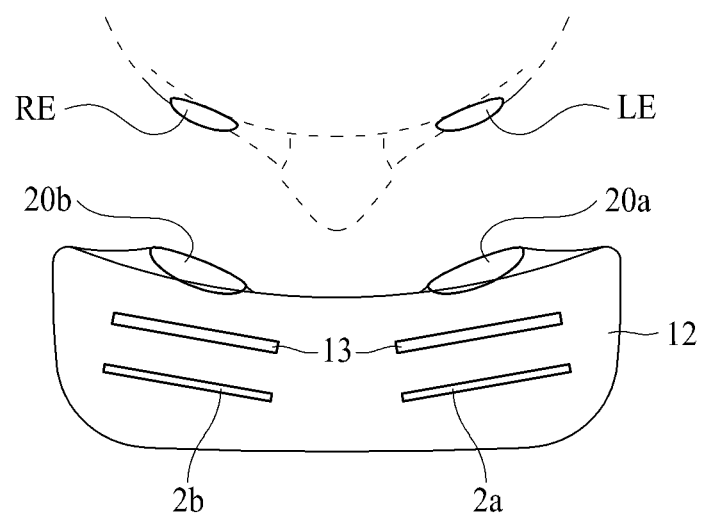
Figure 6C:
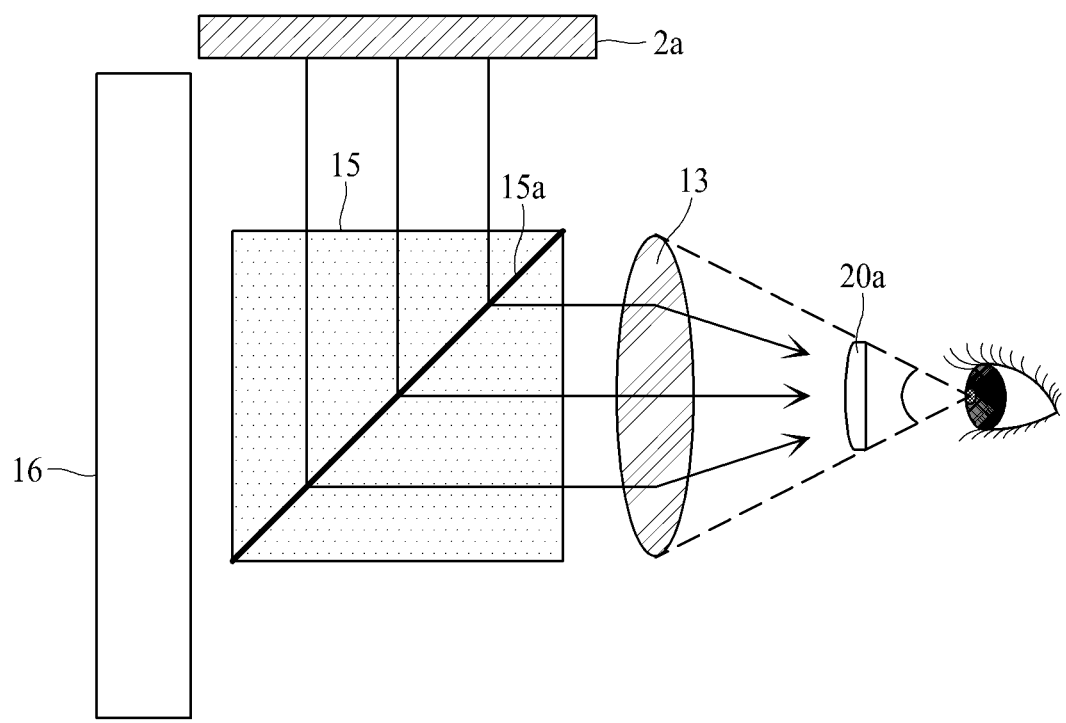

FIGS. 6A to 6C are views illustrating a display device according to another aspect of the present disclosure and relate to a head mounted display (HMD) device. FIG. 6A is schematic perspective view, FIG. 6B is a schematic plan view of a virtual reality (VR) structure, and FIG. 6C is a schematic cross-sectional view of an augmented reality (AR) structure.

As will be aware of it from FIG. 6A, a head mounted display device according to present disclosure comprises a storage case 12 and a head mounted band 14.

The storage case 12 stores elements such as a display device, a lens array, and an ocular lens.

The head mounted band 14 is fixed to the storage case 12. The head mounted band 14 is formed to surround a top surface and both sides of a user's head, but is not limited to this example. The head mounted band 14 is to fix a head mounted display to a user's head and may be replaced with a structure of a shape of a glasses frame or a helmet shape.

As will be aware of it from FIG. 6B, the head mounted display device 1 of a virtual reality (VR) structure according to the present disclosure may include a left eye display device 2a, a right eye display device 2b, a lens array 13, a left eye ocular lens 20a, and a right eye ocular lens 20b.

The left eye display device 2a, the right eye display device 2b, the lens array 13, the left eye ocular lens 20a and the right eye ocular lens 20b are stored in the storage case 12 described above.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 5H described above. For example, each of the left eye display device 2a and the right eye display device 2b may be an organic light emitting display device.

Each of the left eye display device 2a and the right eye display device 2b may include a plurality of subpixels, a circuit element layer 3, a first electrode 5, a bank 6, an organic light emitting layer 7, an auxiliary electrode 8, a passivation layer 9, a second electrode 10, and an encapsulation layer 11, and may display various images by combining colors of light emitted from each of the subpixels in various manners.

The lens array 13 may be provided between the left eye ocular lens 20a and the left eye display device 2a by being spaced apart from each of the left eye ocular lens 20a and the left eye display device 2a. That is, the lens array 13 may be arranged in front of the left eye ocular lens 20a and behind the left eye display device 2a. Also, the lens array 13 may be provided between the right eye ocular lens 20b and the right eye display device 2b by being spaced apparat from each of the right eye ocular lens 20b and the right eye display device 2b. That is, the lens array 13 may be arranged in front of the right eye ocular lens 20b and behind the right eye display device 2b.

The lens array 13 may be a micro lens array. The lens array 13 may be replaced with a pin hole array. Due to the lens array 13, images displayed on a left eye display device 2a or a right eye display device 2b which are magnified may be viewed to a user.

The left eye ocular lens 20a may be arranged corresponding to a left eye LE of a user, and the right eye ocular lens 20b may be arranged corresponding to a right eye RE of a user.

As will be aware of it from FIG. 6C, a head mounted display device of an AR structure according to the present disclosure includes a left eye display device 2a, a lens array 13, a left eye ocular lens 20a, a transmissive reflection portion 15, and a transmissive window 16. Although only a structure for a left eye is shown in FIG. 6C for convenience, a structure for a right eye is the same as the structure for the left eye.

The left eye display device 2a, the lens array 13, the left eye ocular lens 20a, the transmissive reflection portion 15, and the transmissive window 16 are stored in the aforementioned storage case 12.

The left eye display device 2a may be arranged at one side of the transmissive reflection portion 15, for example, at an upper side, without covering the transmissive window 16. Therefore, the left eye display device 2a may provide the transmissive reflection portion 15 with an image without covering an outer background viewed through the transmissive window 16.

The left eye display device 2a may be comprised of an electroluminescence display device according to FIGS. 1 to 5H described above. In this case, the top portion corresponding to the surface where images are displayed in FIGS. 1 to 5H, for example, the color filter layer 4 or the substrate 2 faces the transmissive reflection portion 15.

The lens array 13 may be provided between the left eye ocular lens 20a and the transmissive reflection portion 15.

A left eye of a user is arranged in the left eye ocular lens 20a.

The transmissive reflection portion 15 is arranged between the lens array 13 and the transmissive window 16. The transmissive reflection portion 15 may include a reflective surface 15A which transmits a portion of light and reflects another portion of light. The reflective surface 15A is formed to make an image displayed on the left eye display device 2a to proceed to the lens array 13. Therefore, a user may view all of images displayed on the left eye display device 2a and an outer background through the transmissive window 16. That is, since the user may view one image by overlapping background in reality with virtual images, augmented reality (AR) may be embodied.

The transmissive window 16 is arranged in front of the transmissive reflection portion 15.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
   a substrate provided with a first subpixel, a second subpixel, a third subpixel and a fourth subpixel;
   a first electrode provided on the substrate;
   an organic light emitting layer arranged on the first electrode; and
   a second electrode arranged on the organic light emitting layer,
   wherein the organic light emitting layer includes a first organic light emitting layer and a second organic light emitting layer, and the first organic light emitting layer and the second organic light emitting layer are arranged on the first subpixel, the second subpixel, and the fourth subpixel,
   only the second organic light emitting layer is arranged on the third subpixel,
   only the first organic light emitting layer emits light on the first subpixel and the second subpixel,
   only the second organic light emitting layer emits light on the third subpixel, and
   both of the first organic light emitting layer and the second organic light emitting layer emit light on the fourth subpixel.

2. The display device of claim 1, further comprising:
   an auxiliary electrode arranged between the first organic light emitting layer and the second organic light emitting layer; and
   a passivation layer arranged between the auxiliary electrode and the second organic light emitting layer.

3. The display device of claim 2, wherein the passivation layer electrically insulates the auxiliary electrode from the second electrode.

4. The display device of claim 2, wherein the auxiliary electrode includes a first auxiliary electrode provided on the first subpixel, a second auxiliary electrode provided on the second subpixel, and a third auxiliary electrode provided on the fourth subpixel,
   the first auxiliary electrode and the second auxiliary electrode are connected with the second electrode, and the third auxiliary electrode is not connected with the second electrode.

5. The display device of claim 4, wherein the second electrode is supplied with a voltage different from a voltage supplied to the third auxiliary electrode.

6. The display device of claim 4, wherein the first electrode includes a first sub electrode provided on the first subpixel, a second sub electrode provided on the second subpixel, a third sub electrode provided on the third subpixel, and fourth and fifth sub electrodes provided on the fourth subpixel, and
   the third auxiliary electrode is connected to the fifth sub electrode.

7. The display device of claim 6, further comprising a circuit element layer provided between the substrate and the first electrode,
   wherein the circuit element layer includes a first thin film transistor connected to the first sub electrode, a second thin film transistor connected to the second sub electrode, a third thin film transistor connected to the third sub electrode, a fourth thin film transistor connected to the fourth sub electrode, and a fifth thin film transistor connected to the fifth sub electrode.

8. The display device of claim 1, further comprising a circuit element layer provided between the substrate and the first electrode.

9. The display device of claim 8, further comprising a first color filter arranged to correspond to the first subpixel and a second color filter arranged to correspond to the second subpixel are formed on the circuit element layer, and
   wherein the first color filter and the second color filter are not provided at a position corresponding to the third subpixel and the fourth subpixel on the circuit element layer.

10. The display device of claim 9, further comprising a bank provided between two of the first subpixel, the second subpixel, the third subpixel and the fourth subpixel, partitioning the first subpixel, the second subpixel, the third subpixel, and the fourth subpixel, wherein each of the first color filter and the second color filter partially overlaps the bank.

11. The display device of claim 10, wherein the first electrode includes a first sub electrode provided on the first subpixel, a second sub electrode provided on the second subpixel, a third sub electrode provided on the third subpixel, and a fourth sub electrode provided on the fourth subpixel,
   the bank covers edges of each of the first sub electrode, the second sub electrode, the third sub electrode and the fourth sub electrode,
   a width of the first color filter is the same as or greater than a width of a portion of the first sub electrode which is not covered by the bank, and
   a width of the second color filter is the same as or greater than a width of a portion of the second sub electrode which is not covered by the bank.

12. The display device of claim 1, wherein the second electrode includes a reflective material to reflect light emitted from the organic light emitting layer to the substrate.

13. The display device of claim 1, wherein the first subpixel is provided to emit red light, the second subpixel is provided to emit green light, the third subpixel is provided to emit blue light, and the fourth subpixel is provided to emit white light.

14. The display device of claim 1, wherein the second organic light emitting layers provided in each of the first subpixel, the second subpixel, the third subpixel and the fourth subpixel are connected to one another.

15. The display device of claim 1, wherein the first organic light emitting layer includes a hole injecting layer, a hole transporting layer, a yellow-green light emitting layer, an electron transporting layer, and an electron injecting layer, and wherein the second organic light emitting layer includes a hole injecting layer, a hole transporting layer, a blue light emitting layer, an electron transporting layer, and an electron injecting layer.

16. The display device of claim 1, further comprising a lens array spaced apart from the substrate, and a storage case storing the substrate and the lens array.

17. A display device comprising:
a substrate provided with a first subpixel, a second subpixel, a third subpixel and a fourth subpixel;
a first electrode provided on the substrate;
an organic light emitting layer arranged on the first electrode, wherein the organic light emitting layer includes a first organic light emitting layer and a second organic light emitting layer, and the first organic light emitting layer and the second organic light emitting layer are arranged on the first subpixel, the second subpixel, and the fourth subpixel;
a second electrode arranged on the organic light emitting layer; and
an auxiliary electrode is arranged between the first organic light emitting layer and the second organic light emitting layer, wherein the auxiliary electrode arranged on the first subpixel is electrically connected with the second electrode, wherein the auxiliary electrode arranged on the first subpixel is applied the same voltage as the second electrode, and wherein only the second organic light emitting layer among the first organic light emitting layer and the second organic light emitting layer is arranged on the third subpixel, the auxiliary electrode is not arranged on the third subpixel.

18. The display device of claim 17, further comprising a circuit element layer provided between the substrate and the first electrode.

19. The display device of claim 18, further comprising a first color filter arranged to correspond to the first subpixel and a second color filter arranged to correspond to the second subpixel are formed on the circuit element layer, and wherein the first color filter and the second color filter are not provided at a position corresponding to the third subpixel and the fourth subpixel on the circuit element layer.

20. The display device of claim 19, further comprising a bank provided between two of the first subpixel, the second subpixel, the third subpixel and the fourth subpixel, partitioning the first subpixel, the second subpixel, the third subpixel, and the fourth subpixel, wherein each of the first color filter and the second color filter partially overlaps the bank.

* * * * *